(12) United States Patent
Ferreira et al.

(10) Patent No.: US 9,286,959 B2
(45) Date of Patent: Mar. 15, 2016

(54) LOW LATENCY MEMORY ACCESS CONTROL FOR NON-VOLATILE MEMORIES

(71) Applicant: International Business Machines Corporation, Armonk, NY (US)

(72) Inventors: Alexandre P. Ferreira, Austin, TX (US); Jente B. Kuang, Austin, TX (US); Janani Mukundan, Ithaca, NY (US); Karthick Rajamani, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 14/082,624

(22) Filed: Nov. 18, 2013

(65) Prior Publication Data

US 2015/0143020 A1    May 21, 2015

(51) Int. Cl.
*G11C 11/16*  (2006.01)
*G11C 8/12*  (2006.01)

(52) U.S. Cl.
CPC .............. *G11C 8/12* (2013.01); *G11C 11/1653* (2013.01); *G11C 11/1673* (2013.01)

(58) Field of Classification Search
CPC ... G11C 8/12; G11C 11/1653; G11C 11/1673
See application file for complete search history.

(56) References Cited

U.S. PATENT DOCUMENTS

| | | | |
|---|---|---|---|
| 8,250,298 B2 | 8/2012 | Elnozahy et al. | |
| 8,385,106 B2 | 2/2013 | Ong | |
| 8,441,850 B2 | 5/2013 | Lee et al. | |
| 8,456,901 B2 | 6/2013 | DeBrosse et al. | |
| 8,582,353 B2 | 11/2013 | Lee | |
| 8,582,355 B2 | 11/2013 | Saida et al. | |
| 8,583,947 B2 | 11/2013 | Byom et al. | |
| 8,738,841 B2* | 5/2014 | Olbrich | G06F 13/1657 710/317 |
| 8,756,375 B2* | 6/2014 | Flynn | G06F 1/183 711/103 |
| 8,854,882 B2* | 10/2014 | Strasser | G06F 11/1048 365/185.03 |
| 8,873,329 B1* | 10/2014 | Zheng | G11C 8/08 365/230.01 |
| 8,982,602 B2* | 3/2015 | Sunkavalli | G11C 7/1045 365/148 |
| 9,075,710 B2* | 7/2015 | Talagala | G06F 12/0246 |
| 9,159,419 B2* | 10/2015 | Nellans | G06F 12/0246 |
| 2012/0087184 A1 | 4/2012 | Lee et al. | |
| 2012/0294071 A1 | 11/2012 | DeBrosse et al. | |
| 2013/0148429 A1 | 6/2013 | Kim et al. | |

OTHER PUBLICATIONS

"MRAM (Magnetoresistive Random-Access Memory)", http://www.tech-faq.com/mram-magnetic-memory.html, accessed from the Internet on Nov. 14, 2013, 3 pages.

Daughton, James, "Magnetoresistive Random Access Memory (MRAM)", http://nve.com/Downloads/mram.pdf, Feb. 4, 2000, accessed from the Internet on Nov. 15, 2013, pp. 1-13.

(Continued)

*Primary Examiner* — Evan Pert
(74) *Attorney, Agent, or Firm* — Stephen J. Walder, Jr.; William J. Stock

(57) ABSTRACT

A memory is provided that comprises a bank of non-volatile memory cells configured into a plurality of banklets. Each banklet in the plurality of banklets can be enabled separately and independently of the other banklets in the bank of non-volatile memory cells. The memory further comprises peripheral banklet circuitry, coupled to the bank of a non-volatile memory array, that is configured to enable selected subsets of bit lines within a selected banklet within the plurality of banklets. Moreover, the memory comprises banklet select circuitry, coupled to the peripheral banklet circuitry, that is configured to select data associated with a selected banklet for reading out from the banklet or writing to the banklet.

20 Claims, 12 Drawing Sheets

(56) References Cited

OTHER PUBLICATIONS

Gulur, Nagendra et al., "Multiple Sub-Row Buffers in DRAM: Unlocking Performance and Energy Improvement Opportunities", ICS'12, Jun. 25-29, 2012, pp. 257-266.

Kultursay, Emre et al., "Evaluating STT-RAM as an Energy-Efficient Main Memory Alternative", ISPASS 2013, pp. 256-267.

Udipi, Aniruddha et al., "Rethinking Dram Design and Organization for Energy-Constrained Constrained Multi-Cores", ISCA'10, Jun. 19-23, 2010, pp. 175-186.

* cited by examiner

LOW LATENCY MEMORY ACCESS CONTROL FOR NON-VOLATILE MEMORIES

This invention was made with United Sates Government support under Agreement no. HR0011-13-C-0022 awarded by Defense Advanced Research Projects Agency ("DARPA"). The Government has certain rights in the invention.

BACKGROUND

The present application relates generally to an improved data processing apparatus and method and more specifically to mechanisms for providing low latency memory access control for non-volatile memories.

Various volatile and non-volatile memory technologies have been developed to improve modern computing devices. One example of a volatile memory, i.e. a memory in which the contents of the memory are lost when power to the memory is discontinued, is a Dynamic Random-Access Memory (DRAM). One example of a non-volatile memory, i.e. a memory in which the contents of the memory are not lost when power to the memory is discontinued, is a Magnetoresistive Random-Access Memory (MRAM).

Many modern computing devices use DRAM structures, such as in a main memory, system memory, cache memory, or other memory structures of the computing device. DRAM is a type of volatile random access memory that stores each bit of data in a separate capacitor within an integrated circuit. Since capacitors leak charge, the information in the DRAM cells eventually fades unless the capacitor charge of the DRAM cells is refreshed periodically. Because of this refresh requirement, DRAM is "dynamic" memory as opposed to static random access memory (SRAM) which is "static." The advantage of DRAM over SRAM is that it only requires one transistor and a capacitor per bit of data that is stored as opposed to six transistors in an SRAM per bit of data. This allows DRAM to reach very high density.

Refreshing DRAM cells may be performed on a periodic basis, such as at a predetermined refresh interval. The refreshing of DRAM cells may also occur, for example, in response to the reading of data out of the DRAM cells. That is, a typical read of a portion of a DRAM structure involves reading out the data from the DRAM cells, which effectively deletes the contents of the DRAM cells due to the loss of charge from the reading operation, with a subsequent rewriting of the data back into the same DRAM cells. Thus, each read of a DRAM structure involves the sensing of charge in the DRAM cells with a subsequent recharging of the DRAM cells to their previous state by rewriting the data back into the DRAM cells, consuming power and leading to a source of inefficiency in operation.

Unlike conventional RAM technologies, such as DRAM, data in MRAM is not stored as electric charge or current flows, but is stored using magnetic storage elements. The elements are formed from two ferromagnetic plates, separated by a thin insulating layer, and the resultant magnetic field. One of the two ferromagnetic plates is a permanent magnet set to a particular polarity while the other plate's magnetic field can be changed to match that of an external field to store memory. This configuration is known as a spin valve and is the simplest structure for an MRAM bit. A memory device is built from a gridded array of such "cells" similar to a DRAM. Since the MRAM stores data using magnetic storage elements, the MRAM is a non-volatile memory structure as opposed to the volatile memory structure of a DRAM.

SUMMARY

In one illustrative embodiment, a memory is provided that comprises a bank of non-volatile memory cells configured into a plurality of banklets. Each banklet in the plurality of banklets is separately able to be enabled independently of the other banklets in the bank of non-volatile memory cells. The memory further comprises peripheral banklet circuitry, coupled to the bank of non-volatile memory cells, that is configured to enable selected subsets of bit lines within a selected banklet within the plurality of banklets. Moreover, the memory comprises banklet select circuitry, coupled to the peripheral banklet circuitry, that is configured to select data associated with a selected banklet for reading out from the banklet or writing to the banklet.

In another illustrative embodiment, a method is provided for fabricating an integrated circuit device comprising a memory configured in accordance with the illustrative embodiments. In one such illustrative embodiment, the method comprises providing a bank of non-volatile memory cells configured into a plurality of banklets. Each banklet in the plurality of banklets can be enabled separately and independently of the other banklets in the bank of non-volatile memory cells. The method further comprises providing peripheral banklet circuitry, coupled to the bank of a non-volatile memory cell array, that is configured to enable selected subsets of bit lines within a selected banklet within the plurality of banklets. The method also comprises providing banklet select circuitry, coupled to the peripheral banklet circuitry, that is configured to select data associated with a selected banklet for reading out from the banklet or writing to the banklet. In addition, the method comprises fabricating an integrated circuit device comprising the provided bank, peripheral banklet circuitry, and banklet select circuitry.

In still another illustrative embodiment, a computer is provided that comprises a processor and a memory coupled to the processor. The memory comprises a bank of non-volatile memory cells configured into a plurality of banklets. Each banklet in the plurality of banklets is separately able to be enabled independently of the other banklets in the bank of non-volatile memory cells. The memory further comprises peripheral banklet circuitry, coupled to the bank of non-volatile memory cells, that is configured to enable selected subsets of bit lines within a selected banklet within the plurality of banklets. Moreover, the method comprises banklet select circuitry, coupled to the peripheral banklet circuitry, that is configured to select data associated with a selected banklet for reading out from the banklet or writing to the banklet.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide mechanisms for providing low latency memory access control for non-volatile memories, such as Magnetoresistive Random Access Memories (MRAMs) or Spin Transfer Torque MRAMs (STT-MRAMs), as described hereafter. The illustrative embodiments provide improvements over known Dynamic Random Access Memories (DRAMs) and MRAMs by providing mechanisms for accessing sub-arrays of a memory structure, referred to herein as "banklets," in such a manner that power consumption is reduced and density of access operations (reads and writes) is increased. Thus, in order to illustrate the improvements of the illustrative embodiments over known memory structures, a description of known DRAM and MRAM structures will first be provided followed by a detailed description of the improvements of the illustrative embodiments.

Figure 1:
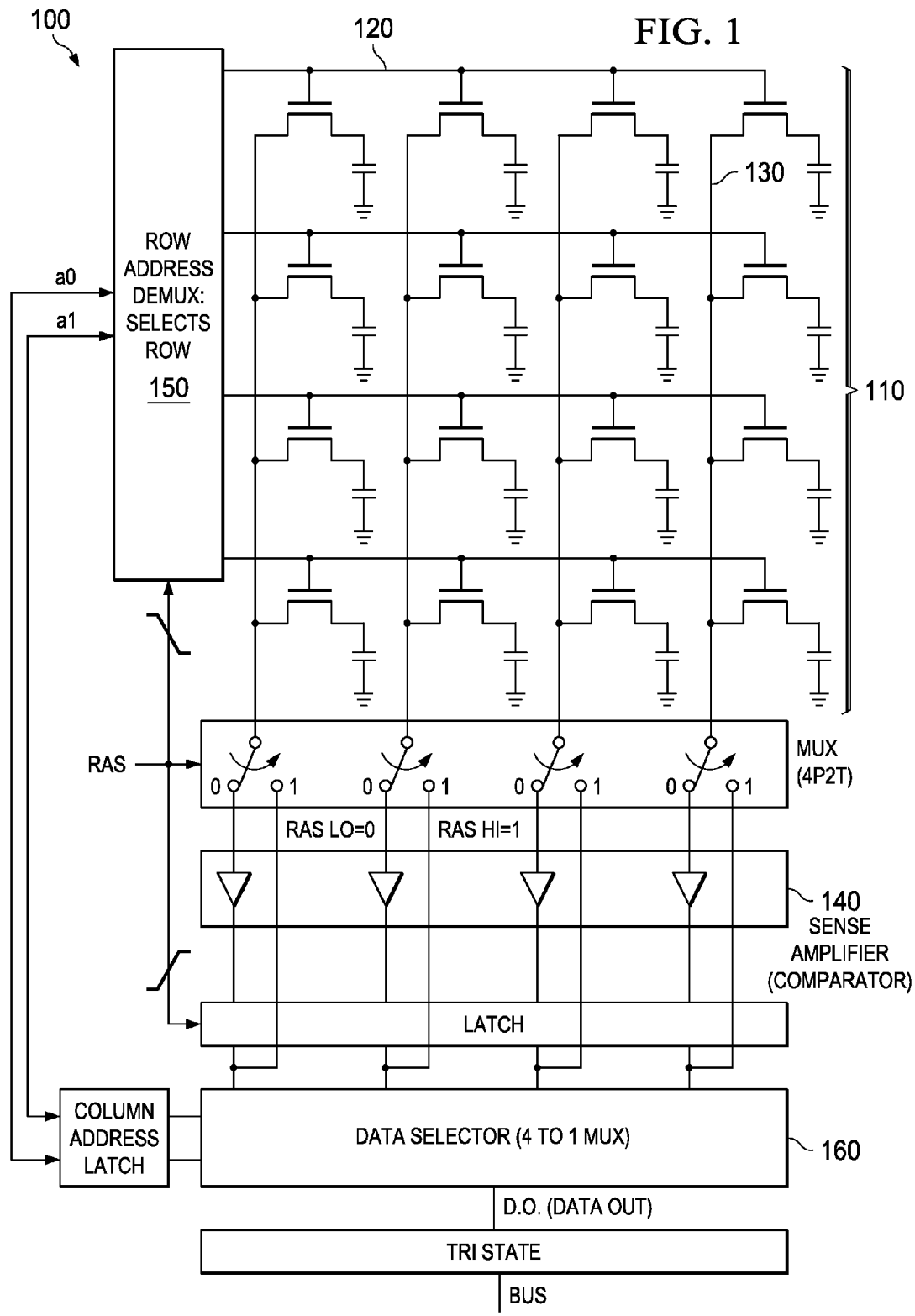
FIG. 1 is an example circuit diagram of a known DRAM subarray.

FIG. 1 is an example circuit diagram of a known DRAM structure 100. As is generally known in the art, a DRAM structure 100 usually comprises a square array of memory cells 110, with each cell comprising a single capacitor and a single transistor. Signal lines connecting each row of the array are known as word lines 120. Each column of the array is actually composed of two bit lines (only one is shown for simplicity) 130, each one connected to every other memory cell in the column. These bit lines 130 are generally known as the + and − bit lines. A sense amplifier 140 is typically provided as a pair of cross-connected inverters between the bit lines 130. That is, the first inverter is connected from the + bit line to the − bit line, and the second inverter is connected from the − bit line to the + bit line. This is an example of a positive feedback sense amplifier 140 in which the arrangement is only stable when one bit line has a high logic level state and the other bit line has a low logic level state.

With this known DRAM structure 100 arrangement, to read a bit from a column, the following operations take place. First, the sense amplifier 140 is switched off and the bit lines 130 are pre-charged to exactly matching voltages that are intermediate between high and low logic levels. The bit lines 130 are constructed symmetrically to keep them balanced as precisely as possible. The pre-charge circuitry (not shown) is then switched off. Because the bit lines 130 are very long, their capacitance will hold the pre-charge voltage for a brief time.

The selected row's word line 120, as determined by the row address demux 150, is then driven high. This connects one storage capacitor of one of the memory cells to one of the two bit lines. Charge is shared between the selected storage cell and the appropriate bit line 130, slightly altering the voltage on the bit line 130. Although every effort is made to keep the capacitance of the storage cells high and the capacitance of the bit lines low, capacitance is proportional to physical size, and the length of the bit lines 130 means that the net effect is a very small perturbation of one bit line's voltage.

The sense amplifier 140 is then switched on. The positive feedback takes over and amplifies the small voltage difference until one bit line is at a fully low logic level state and the other is fully high logic level state. At this point, the row is "open" and a column can be selected. "Read" data is taken from the DRAM structure 100 by the sense amplifier 140, as selected by a column address via data selector 160. Many reads can be performed while the row is open in this way.

While reads of the open row proceed, current is flowing back up the bit lines 130 from the sense amplifier 140 to the memory cells. This restores, or "refreshes," the charge in the memory cell. Due to the length of the bit lines 130, this takes significant time beyond the end of sense amplification, and overlaps with one or more column reads. Moreover, this refreshing or rewriting requires additional power consumption which may be unnecessary for memory cells storing data that will be soon overwritten or is available from another memory structure in the computing or data processing system.

When done with the current row, the word line 120 is switched off to disconnect the storage capacitors, i.e. the row is "closed." The sense amplifier 140 is then switched off and the bit lines 130 are pre-charged again.

To write to a DRAM structure 100 the row to be written to is "opened" and a given column's sense amplifier 140 is temporarily forced to a desired state so that it drives the bit line 130 which charges the capacitor to the desired value. Due to the positive feedback, the sense amplifier 140 will then hold the bit line 130 stable even after the forcing of the state of the sense amplifier 140 is removed. During a write to a particular DRAM cell, the entire row is read out, portions of the row are changed, and then the entire row is written back in. The refreshing and rewriting of data in a DRAM cell requires additional power consumption and incurs a potential performance penalty, since the cells are unavailable for reads or writes while they are being refreshed.

Figure 2:
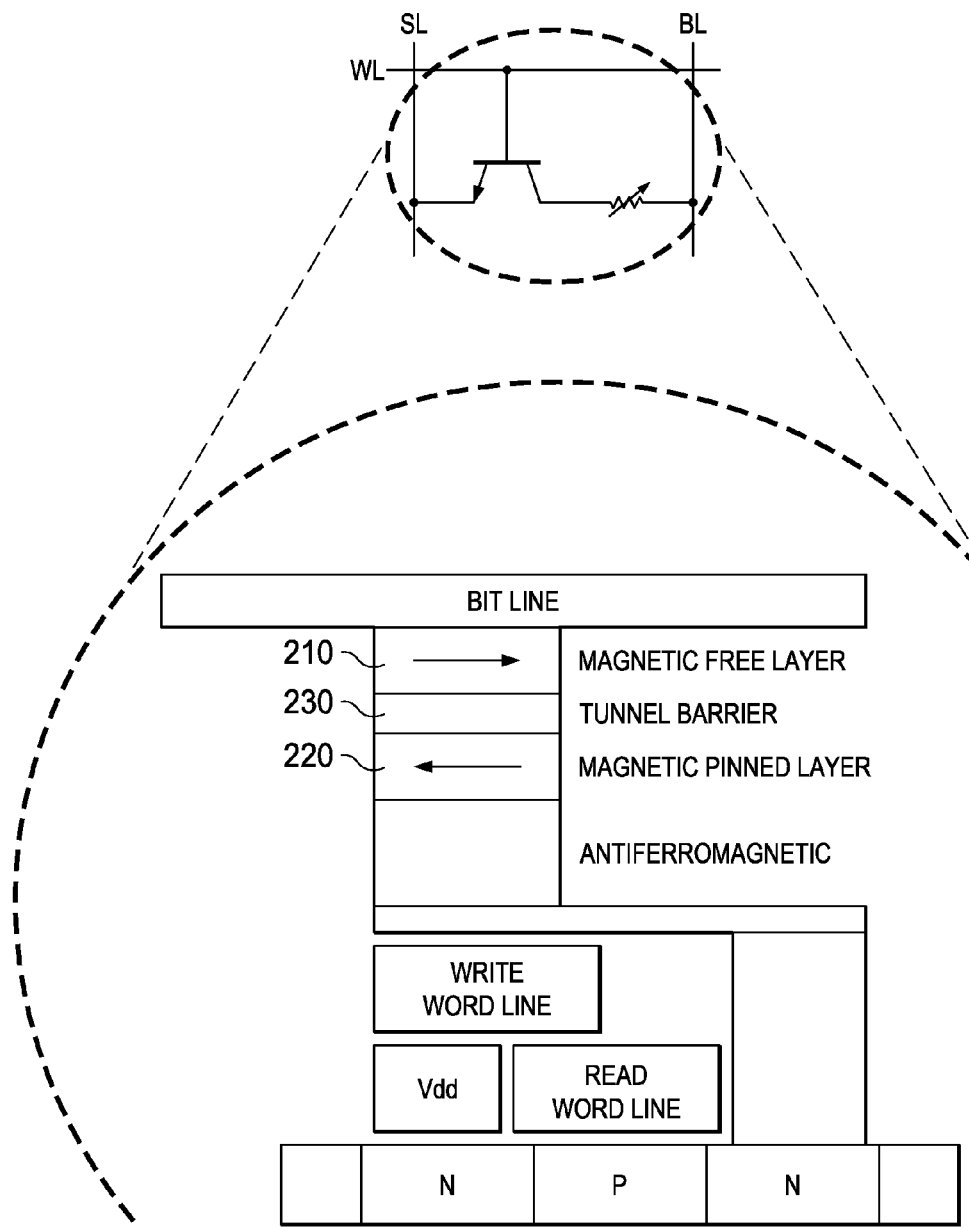
FIG. 2 is an example schematic and cross sectional diagram of a known MagnetoResistive RAM (MRAM) cell.

FIG. 2 is an example diagram of a known Magnetoresistive RAM (MRAM) cell. The MRAM cell comprises a magnetic memory element (also referred to as a tunneling magnetoresistive, or TMR device) which includes a structure having ferromagnetic layers 210, 220 separated by a non-magnetic layer or tunnel bather 230, and arranged into a magnetic tunnel junction (MTJ). Digital information is stored and represented in the memory element as directions of magnetization vectors in the magnetic layers. More specifically, magnetic vectors in one magnetic layer 220 (also referred to as a reference layer) are magnetically fixed or pinned, while the magnetization direction of the other magnetic layer 210 (also referred to as a "free" layer) may be switched between the same direction and the opposite direction with respect the fixed magnetization direction of the reference layer. The magnetization directions of the free layer are also known as "parallel" and "antiparallel" states, wherein a parallel state refers to the same magnetic alignment of the free and reference layers, while an antiparallel state refers to opposing magnetic alignments there-between.

Depending upon the magnetic state of the free layer 210 (parallel or antiparallel), the magnetic memory element exhibits two different resistances in response to a vertically applied current with respect to the TMR device. The particular resistance of the TMR device thus reflects the magnetization state of the free layer 210, wherein resistance is "low" when the magnetization is parallel and "high" when the magnetization is antiparallel. Accordingly, a detection of changes in resistance allows an MRAM device to provide information stored in the magnetic memory element (i.e. a read operation). In addition, a MRAM cell is written to through the application of a bi-directional current in a particular direction, in order to magnetically align the free layer 210 in a parallel or antiparallel state.

Thus, the simplest method of reading a MRAM cell is accomplished by measuring the electrical resistance of the cell. A particular MRAM cell in an array of MRAM cells is selected by powering an associated transistor that switches current from a supply line through the MRAM cell to ground. Due to the magnetic tunnel effect, the electrical resistance of the MRAM cell changes due to the orientation of the fields in the two layers as discussed above. By measuring the resulting current, the resistance inside any particular MRAM cell can be determined, and from this the polarity of the free layer. Typically if the two layers have the same polarity (parallel) this is considered to mean "1", while if the two layers are of opposite polarity (antiparallel) the resistance will be higher and this means "0".

Data is written to the MRAM cells using a variety of means. In the simplest case, each MRAM cell lies between a pair of write lines (or a write line (WL) and select line (SL)) 240, 250 arranged at right angles to each other. When current is passed through them, an induced magnetic field is created at the junction, which the free layer 210 picks up. This approach requires a fairly substantial current to generate the field, which makes it less interesting for low-power uses, one of MRAM's primary disadvantages. Additionally, as the device is scaled down in size, there comes a time when the induced field overlaps adjacent MRAM cells over a small area, leading to potential false writes.

A newer technique, spin transfer torque (SIT), or spin transfer switching, uses spin-aligned ("polarized") electrons to directly torque the domains. Specifically, if the electrons flowing into a layer have to change their spin, this will develop a torque that will be transferred to the nearby layer. This lowers the amount of current needed to write the MRAM cells, making the current requirement approximately the same as the read process.

As mentioned above, the illustrative embodiments improve upon the volatile memory structure of a DRAM by utilizing an improved non-volatile memory architecture that allows for isolated sub-array, or "banklet," access within the non-volatile memory architecture. In particular, the illustrative embodiments leverage the concept and configuration of "banklets" with the non-volatile nature of the non-volatile memory, hereafter using STT-MRAM as a non-limiting example in this description for illustrative purposes, and using a command interpretation mechanism within a memory chip to improve both power and performance of the non-volatile memory. The illustrative embodiments are compatible with the command specification and chip external interfaces set forth in the Joint Electron Device Engineering Council (JEDEC) DDR3/DDR4 specifications and thus, known controllers may be used with the improved mechanisms of the illustrative embodiments.

With the mechanisms of the illustrative embodiments, a STT-MRAM array architecture can be segmented into banklets allowing for partial activation and isolation of the banklets. A bank is a memory array with dedicated row and column decoder, sense-amp set, row buffer, and I/O lanes from the sense-amp set to the row buffer. A banklet is a portion of a memory array within a bank with its own independent row buffer, independently controlled read-write circuits, and independent read-write column switches fed from the column decoder of the bank. Multiple banklets make up a bank and share a common row decoder, i.e. a single row can be activated across multiple banklets.

Because the STT-MRAM array architecture may be segmented, both physically and virtually, into banklets, the mechanisms of the illustrative embodiments make it possible to activate only a required set of bit lines, i.e. within one banklet. That is, with the mechanisms of the illustrative embodiments, banklets share the word lines of their corresponding bank, but each banklet has exclusive banklet enable lines that active their corresponding sense-amp enable (SAE) and write enable (WE) signals. Banklet select circuitry is provided to generate banklet enable signals however the row decoder and column decoder inputs are unchanged from traditional DRAM design. By keeping the row decoder and column decoder inputs unchanged from traditional DRAM designs, the mechanisms of the illustrative embodiments may be used with the standard JEDEC command protocol. However, this is not a requirement of the mechanisms of the illustrative embodiments and those of ordinary skill in the art will recognize that performance enhancements may be achieved by modification to timing and command sequences without departing from the spirit and scope of the illustrative embodiments.

Isolating banklets provides two main advantages. A first main advantage is that the isolation enables tighter overlap (closer packing) of read/write operations since different banklets can be servicing reads and writes for different data simultaneously on the same row, e.g., read and write commands to different banklets can issue just one command cycle apart, which leads to an improvement in performance of the memory array. The second main advantage is that idle banklets can be turned off and thereby reduce power/energy consumption. In addition, since the non-volatile memory, e.g., STT-MRAM, does not require that the cells of the memory be pre-charged or a data restore to be performed to maintain the state of the cells, these characteristics of the non-volatile memory may be leveraged to reduce latency and allow a more aggressive timing model for reads/writes.

The above aspects and advantages of the illustrative embodiments of the present invention will be described in greater detail hereafter with reference to the accompanying figures. It should be appreciated that the figures are only intended to be illustrative of exemplary embodiments of the present invention. The present invention may encompass aspects, embodiments, and modifications to the depicted exemplary embodiments not explicitly shown in the figures but would be readily apparent to those of ordinary skill in the art in view of the present description of the illustrative embodiments.

As will be appreciated by one skilled in the art, aspects of the present invention may be embodied as a system, method, apparatus, device, or the like. Moreover, the mechanisms of the illustrative embodiments may be implemented in conjunction with software instructions, command protocols, or the like, executed/implemented by one or more processors of a data processing system, apparatus, device, or the like, in which the illustrative embodiments are implemented. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium is a system, apparatus, or device of an electronic, magnetic, optical, electromagnetic, or semiconductor nature, any suitable combination of the foregoing, or equivalents thereof. More specific examples (a non-exhaustive list) of the computer readable storage medium would include the following: an electrical device having a storage capability, a portable computer diskette, a hard disk, a random access memory (RAM), a read-only memory (ROM), an erasable programmable read-only memory (EPROM or Flash memory), an optical fiber based device, a portable compact disc read-only memory (CDROM), an optical storage device, a magnetic storage device, or any suitable combination of the foregoing. In the context of this document, a computer readable storage medium is any tangible medium that can contain or store a program for use by, or in connection with, an instruction execution system, apparatus, or device.

In some illustrative embodiments, the computer readable medium is a non-transitory computer readable medium. A non-transitory computer readable medium is any medium that is not a disembodied signal or propagation wave, i.e. pure signal or propagation wave per se. A non-transitory computer readable medium may utilize signals and propagation waves, but is not the signal or propagation wave itself. Thus, for example, various forms of memory devices, and other types of systems, devices, or apparatus, that utilize signals in any way, such as, for example, to maintain their state, may be considered to be non-transitory computer readable media within the scope of the present description.

A computer readable signal medium, on the other hand, may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Similarly, a computer readable storage medium is any computer readable medium that is not a computer readable signal medium.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As mentioned above, the illustrative embodiments provide mechanisms for leveraging the concept of banklets, and the ability to individually access banklets in an isolated manner, with the benefits of non-volatile memories using a different command interpretation within the chip to improve both power and performance of the memory circuit. To illustrate the differences between the improved mechanisms of the illustrative embodiments and the known mechanisms utilized in present day computing devices, an DRAM organization will be first described followed by the banklet enabled memory array organization of the illustrative embodiments.

Figure 3:
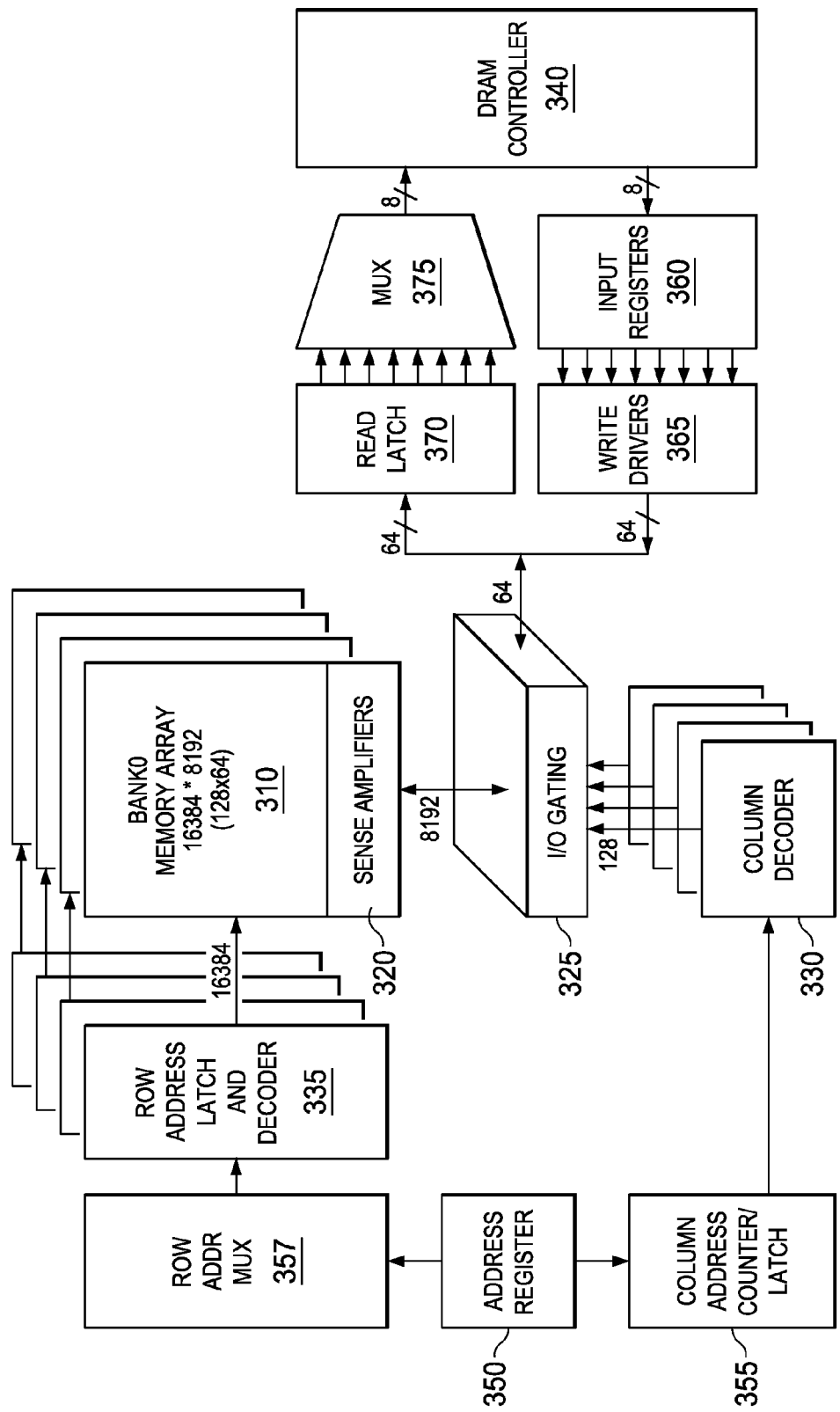
FIG. 3 is an example diagram of a known dynamic random access memory (DRAM) architecture.

FIG. 3 is an example diagram of a known dynamic random access memory (DRAM) architecture. The DRAM architecture 300 comprises a memory array 310 and associated sense amplifiers 320. The sense amplifiers 320 receives signals from a column decoder 330, via the input/output gating logic 340 to select a column, i.e. bit lines, in the memory array 310. The IO gating logic 340 connects the specific set of sense amplifiers (64 out of 8192 in the depicted example) to the IO pins (latches) allowing transfer of information either to read (sense amplifier to latch) or to write (latch to sense amplifier).

A row decoder 335 provides signals to the memory array 310 to open and close rows of the memory array 310, in the manner previously described above. The decoders 330 and 335 operate based on the row and column information in read/write address register 350. The row address latch and decoder 335, via the row address multiplexer 357, and column address counter and latch 355 store the addresses that are used to select the specific word and columns to be operate don in the memory array 310. In a DRAM architecture, the activate command initiates the memory array read operation and the precharge command deactivates the word line and prepares the bit lines for the next operation. The read and write commands only operate in the sense amplifiers so the row address is latched in the activate command and not modified until the precharge command is sent. The column address is transient and is used during a read or write operation. As shown in FIG. 3, there may be separate sense amplifiers 320, column decoders 330, and address decoders 335 for each of the DRAM memory arrays 310 in the DRAM architecture 300.

A DRAM controller 340 receives read command signals, write command signals, and refresh command signals. The DRAM controller 340 provides control signals and receives data signals, via the input registers 360 and write drivers 365 and read latch 370 and corresponding multiplexer 375, to/from I/O gating logic 325 for reading/writing data from/to the memory array 310.

Figure 4:
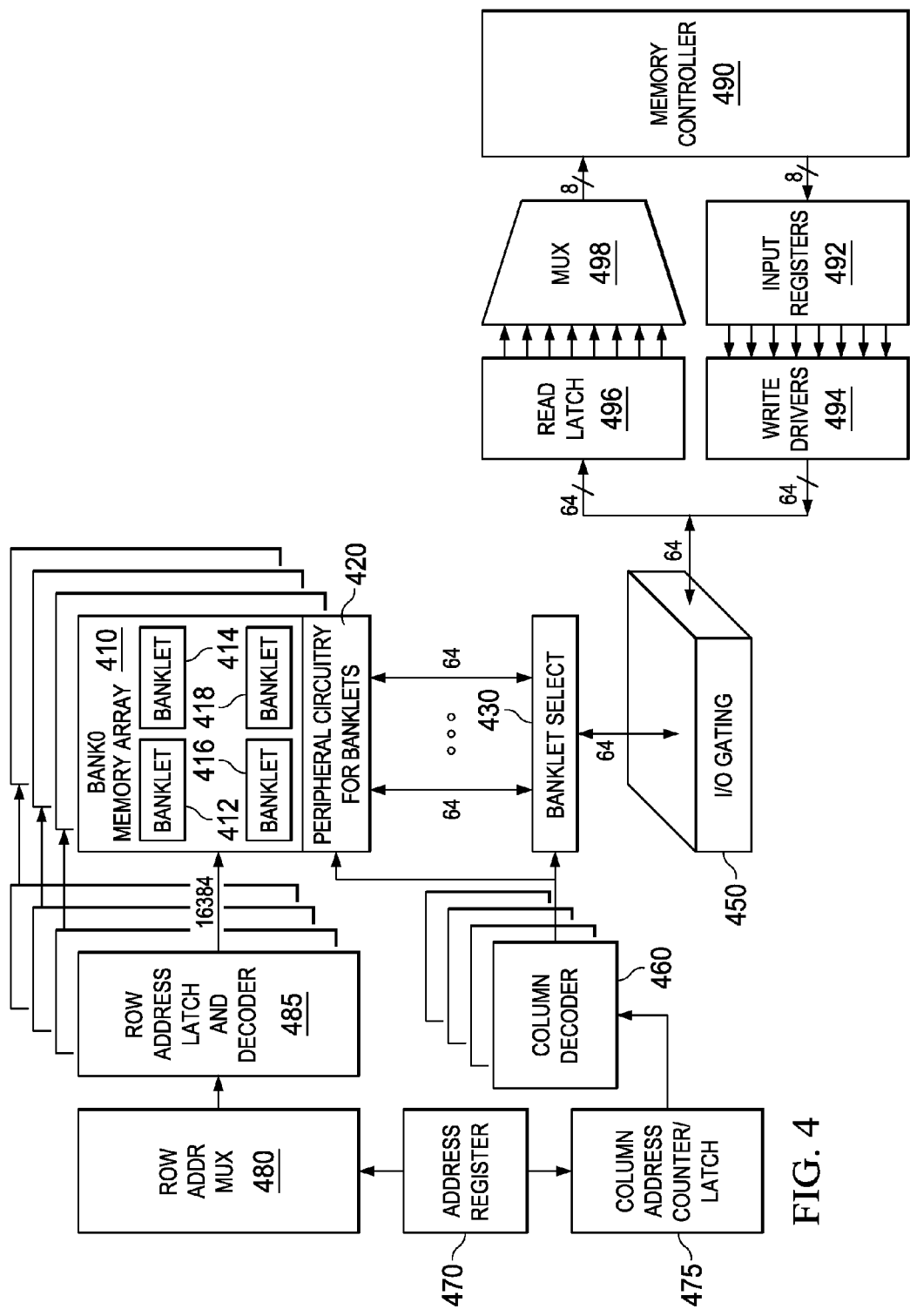
FIG. 4 is an example diagram illustrating a MRAM architecture in accordance with one illustrative embodiment.

In contrast to the DRAM architecture shown in FIG. 3, the illustrative embodiments utilize a non-volatile memory architecture, and in illustrative embodiments described herein this will be considered to be a MRAM architecture, in which the MRAM arrays are comprised of banklets which may be individually selected within a MRAM array and enabled. FIG. 4 is an example diagram illustrating a MRAM architecture in accordance with one illustrative embodiment. The MRAM architecture shown in FIG. 4 is designed to be compatible with DRAM specifications and thus, is similar to the configuration in FIG. 3 with the exception of the memory arrays being comprised of MRAM cells and being segmented into banklets, the MRAM arrays having peripheral banklet circuitry for isolated access of individual banklets within a MRAM array, and further in that banklet select circuitry is provided, as described hereafter.

That is, as shown in FIG. 4, the MRAM architecture 400 comprises one or more MRAM arrays or banks 410. Each MRAM bank 410 comprises a plurality of banklets 412-418. In the depicted example, each MRAM bank 410 comprises four banklets 412-418 with each banklet comprising a sub-array of MRAM cells. It should be appreciated that while the depicted example shows the MRAM bank 410 comprising four banklets, the illustrative embodiments are not limited to such and nay number of banklets may be used without departing from the spirit and scope of the illustrative embodiments. Each banklet 412-418 in a bank 410 share word lines but have exclusive banklet enable lines that activate their corresponding sense-amp enable (SAE) lines and write enable (WE) lines.

Associated with each MRAM bank 410 is peripheral banklet circuit 420. The peripheral banklet circuit 420 comprises circuitry for receiving a banklet enable and multiplexer select signal and thereby enabling a bit line for a particular MRAM cell in a selected banklet of the MRAM bank 410 to thereby read/write to the individual MRAM cell. The banklet enable signal and multiplexer select signal are generated by the column decoder 460 and is provided to the peripheral banklet circuitry 420 and banklet select circuit 430. With regard to generating the banklet enable signal, the column address referenced in a read/write command activates the corresponding banklet to fulfill the access request (read/write) where a predetermined number of bits of the column address are used to determine which banklet is being accessed. A latch per banklet in the column decoder 460 may be used to store the column address provided and the latch may set the multiplexers and sense amplifiers. Thus, the column address may be used both to select a correct banklet and to set the multiplexers and sense amplifiers for the banklet to which the access request is directed.

The peripheral banklet circuitry 420 receives the multiplexer select signal and banklet enable signal which causes corresponding multiplexers in the peripheral banklet circuitry 420 to select a bit line to enable and assert a select enable signal. The banklet enable signal received by the banklet select circuitry 430 is used by the banklet select circuitry 430 to select a corresponding output from a banklet 412-418 to read from the MRAM bank 410 or select a corresponding banklet 412-418 to write to in the MRAM bank 410.

With the arrangement shown in FIG. 4, read access to a banklet 412-418, such as banklet 412, in a MRAM bank 410 is controlled through a command sequence comprising an activate command that raises the bank word line across all banklets 412-418 in the MRAM bank 410, and a read command that activates the column circuit for enabling the MRAM cells in a column within the selected banklet 412 and enables the sense amp circuit for the column. The data from the MRAM cells in the column are output for that particular banklet access. The banklet select circuitry 430 selects the data for the particular selected banklet which then outputs the data to the I/O gating logic 450 which then outputs the data to the read latch 496, and so on.

For a write access to a banklet 412-418, such as banklet 412, in the MRAM bank 410, the write access is again controlled though a command sequence that is initiated by an activate command that raises the bank word line across all banklets 412-418 of a MRAM bank 410. The activate command is followed by a write command that activates the column circuit for the column to which the write is to be performed. This causes the write driver to be set up to write to the selected column and the data is written to the corresponding MRAM cells of the selected column. The write drivers are composed of a voltage source and a sink (a transistor to VCC and another transistor to GND is sufficient). The write has to provide a bidirectional current, one direction to store 0 and another to store 1. Thus, the setup of the write driver is turning on the required transistor (VCC or GND).

The operation of the other elements 450 and 470-498 is similar to corresponding elements that are described in FIG. 3 with regard to the DRAM architecture 300. Thus, the row decoder 485 and column decoder 460 inputs to the memory array 410 are unchanged from the DRAM architecture 300 other than to have the column decoder 460 generate, in addition to the column select (or multiplexer select) signal, generates a banklet enable signal for selecting a particular banklet within the MRAM bank 410. As mentioned above, the column decoder 460 may have a specific latch for each banklet which stores the column address for that banklet.

Figure 5:
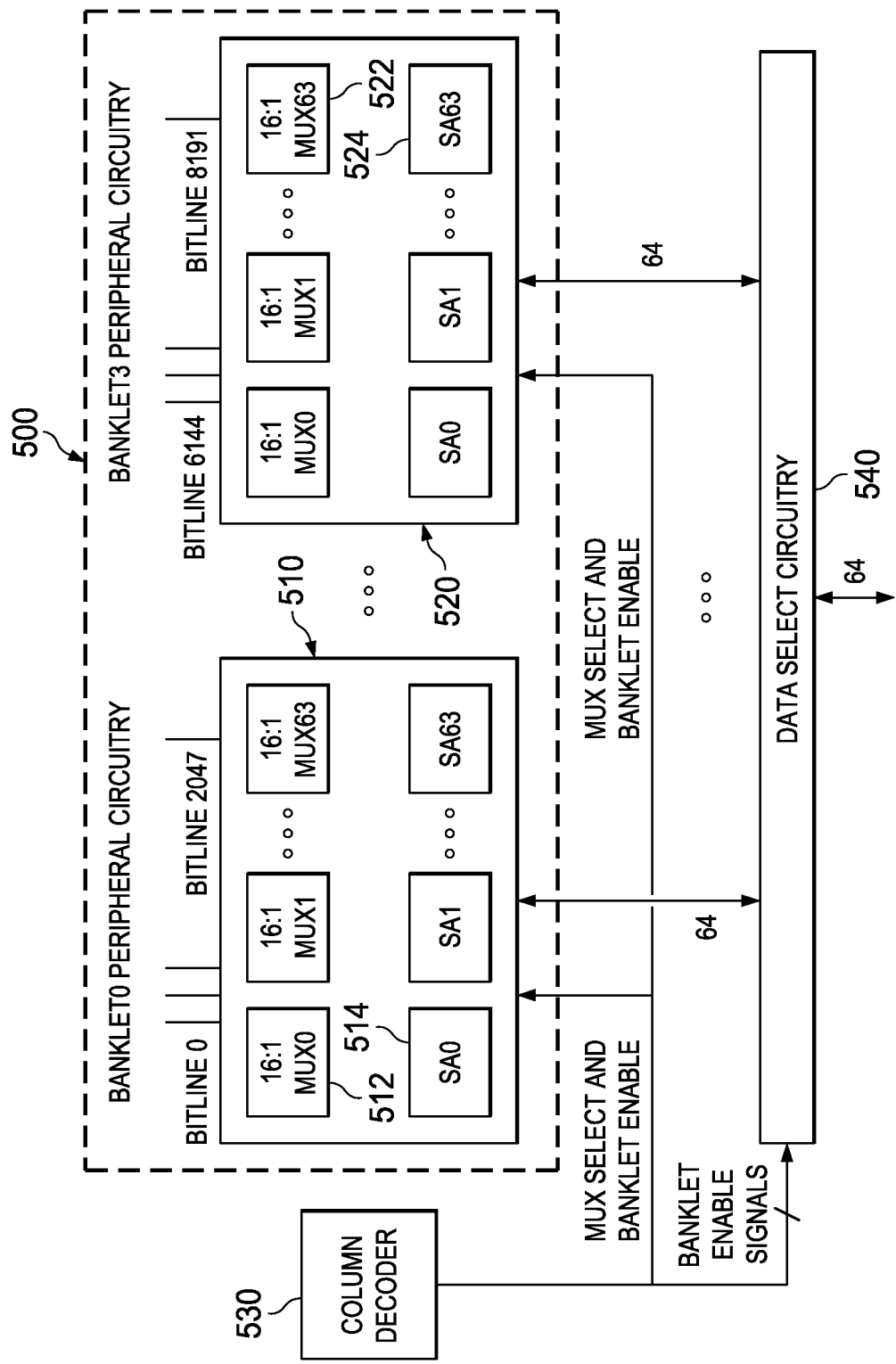
FIG. 5 is an example diagram of the peripheral banklet circuitry in accordance with one illustrative embodiment.

FIG. 5 is an example diagram of the peripheral banklet circuitry in accordance with one illustrative embodiment. As shown in FIG. 5, the peripheral banklet circuitry 500 comprises a plurality of peripheral circuitry modules 510-520, one for each banklet of the corresponding MRAM bank. The peripheral circuitry modules 510-520 comprise a plurality of multiplexers 512, 522, one for each column of MRAM cells in the corresponding banklet, and a plurality of corresponding sense amps (SA0-SA63) 514, 524, one for the each column of MRAM cells in the corresponding banklet. The peripheral circuitry modules 510-520 receive the multiplexer select and banklet enable signals from the column decoder 530 as input and output enable signals on bit lines corresponding to the multiplexer select signal. The banklet enable signal activates the sense amp enable and write enable signals for reading and writing from/to the corresponding MRAM cells of the banklet enabled by the banklet enable signal. The banklet enable signals are further input to the banklet select circuitry 540 from the column decoder 530 which selects data from or destined for a particular banklet specified by the banklet enable signal.

The generation of the banklet enable signal from the column decoder 530 allows for the independent gating of the banklets for power reduction and allows parallel operations among the banklets. Hence, different banklets may be servicing reads and writes for different data simultaneously on the same row, i.e. read and write commands to different banklets can be issued just one command cycle apart. That is, each banklet is independent of the other banklets and can be reading or writing to a column independent of the other banklets. Since the I/O is shared, the data transfer portion of a read or write operation may not be executed simultaneously, however the decoding and sensing portion can be executed at substantially a same time. All active banklets operate on the same row (share the same row decoder output) and thus, if a read or write is sent to a banklet, only those sense amplifiers for the cells that are being accessed are activated.

In addition, idle banklets may be turned off to thereby reduce power/energy consumption. That is, banklets that are not being read/written do not have their bit lines, sense amplifiers, or the like, powered since the MRAM cells maintain their state in a non-volatile manner.

Figure 6:
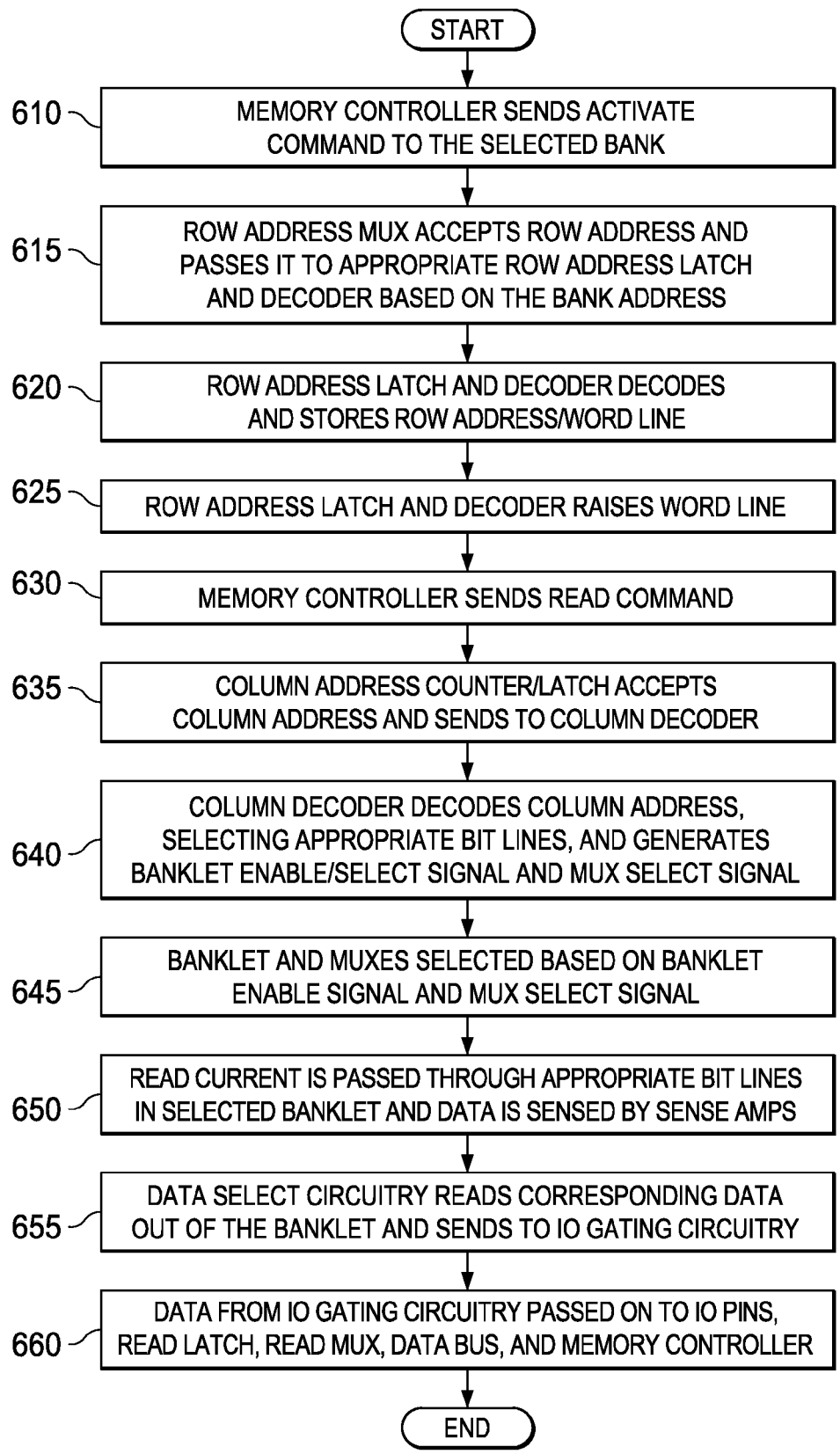
FIG. 6 is a flowchart outlining an example operation for performing a read operation using an improved non-volatile memory in accordance with one illustrative embodiment.

FIG. 6 is a flowchart outlining an example operation for performing a read operation using an improved non-volatile memory in accordance with one illustrative embodiment. As shown in FIG. 6, the read operation starts with the memory controller sending an Activate command that identifies row address/word line that needs to be raised/activated (step 610). The row address multiplexer 480 accepts the row address and passes it to an appropriate row address latch and decoder 485 based on the bank address (step 615).

The row address latch and decoder 485 decodes and stores the appropriate row address/word line (step 620). The row address latch and decoder 485 raises (activates) the appropriate word line (step 625) and the memory controller sends the Read command, where the Read command includes the column address identifying the columns that need to be read out and the banklet select/enable signal is determined from the column address in the Read command that is sent by the memory controller (step 630). The column address counter/latch 475 accepts the column address and sends the column address to the column decoder 460 (step 635). The column decoder 460 decodes the column address, which includes selecting the appropriate bit lines as well as generating the banklet enable/select signal and the multiplexer (mux) select signal (step 640). Using the banklet enable signal and mux select signal, appropriate banklet and muxes are selected (step 645). A read current is then passed through the appropriate bit lines in the selected banklet and data is sensed (read) by the sense amps (step 650). Once data sensing is complete, the data select circuitry 430 reads the corresponding data out of the banklet and sends it to the IO gating circuitry 450 (step 655). Data from the IO gating circuitry 450 is then passed on to the IO pins, the read latch 496, the read mux 498, the data bus, and finally to the memory controller 490 (step 660). The operation then terminates.

Figure 7:
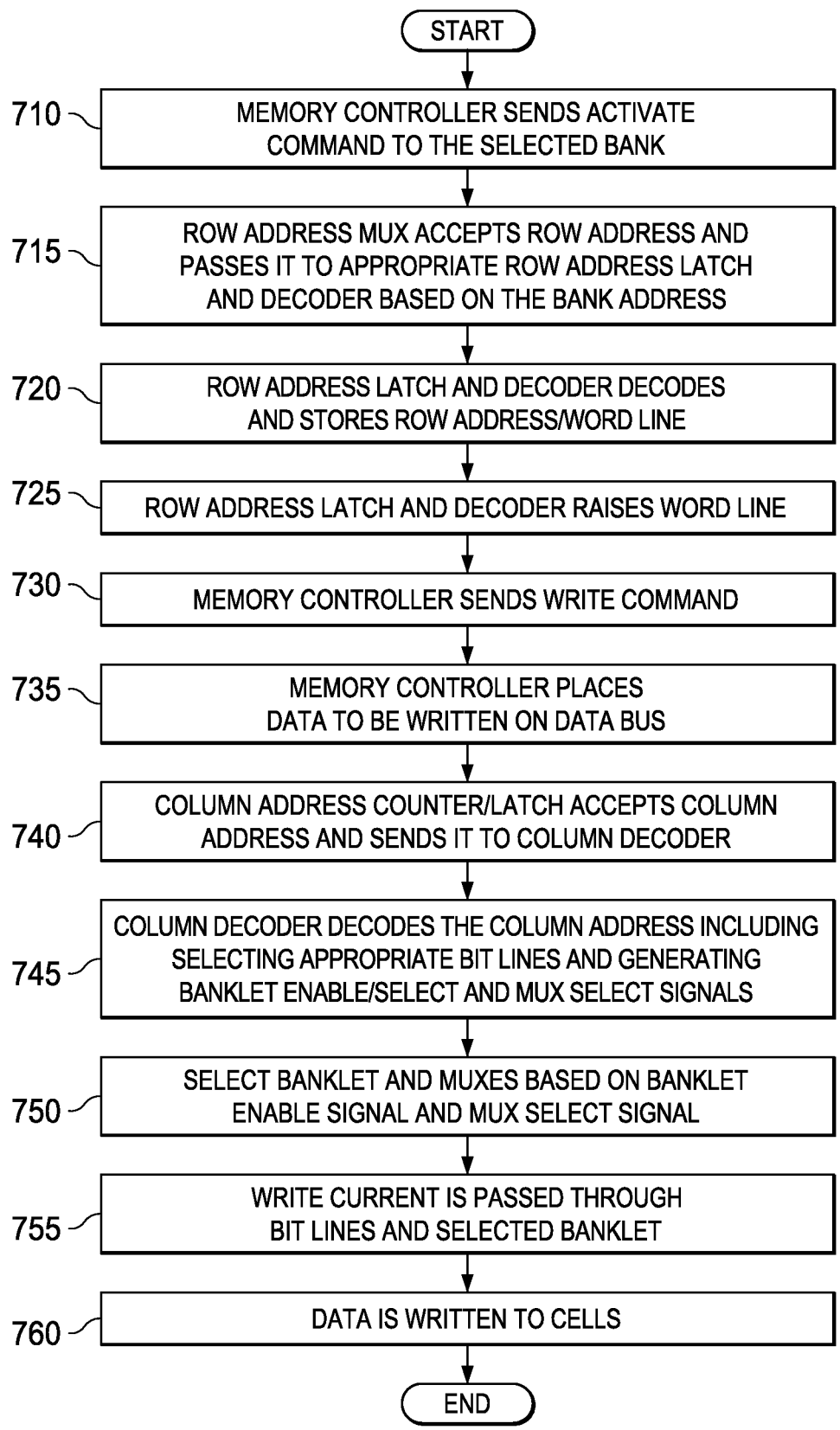
FIG. 7 is a flowchart outlining an example operation for performing a write operation using an improved non-volatile memory in accordance with one illustrative embodiment.

FIG. 7 is a flowchart outlining an example operation for performing a write operation using an improved non-volatile memory in accordance with one illustrative embodiment. As shown in FIG. 7, the write operation starts with the memory controller sending an Activate command that identifies row address/word line that needs to be raised/activated (step 710). The row address multiplexer 480 accepts the row address and passes it to an appropriate row address latch and decoder 485 based on the bank address (step 715).

The row address latch and decoder 485 decodes and stores the appropriate row address/word line (step 720). The row address latch and decoder 485 raises (activates) the appropriate word line (step 725) and the memory controller sends the Write command, where the Write command includes the column address identifying the columns that need to be written to and the banklet select/enable signal is determined from the column address in the Write command that is sent by the memory controller (step 730).

The memory controller 490 places the data to be written on the data bus, which is then first stored in the input registers 492, passed on to the write drivers 494, and then to the IO pins and the IO gating circuitry 450 (step 735). The column address counter/latch 475 accepts the column address and sends the column address to the column decoder 460 (step 740). The column decoder 460 decodes the column address, which includes selecting the appropriate bit lines as well as generating the banklet enable/select signal and multiplexer (mux) select signal (step 745). Using the banklet enable signal and multiplexer select signal, appropriate banklet and muxes are selected (step 750). A write current is then passed through the appropriate bit lines in the selected banklet (step 755) and data is written to the corresponding STT-MRAM cells (step 760). The operation then terminates.

With the improved non-volatile memory architecture utilizing banklets as described above, various memory controller optimizations are made possible with regard to scheduling memory requests to improve concurrency and/or reduce energy consumption. In accordance with the illustrative embodiments, a memory controller optimization is made possible in that the sensing of memory banklet cells is moved from the activate command to the read command. This facilitates leveraging banklet isolation for improved power and performance since only a certain specified number of bit lines are sensed.

The movement of the sensing from the Activate command to the Read command is allowed by the configuration and operation of the memory cells of the illustrative embodiments. That is, in the DRAM operation, the row activation and sensing is done at the Activate command since they are intrinsically connected. The row activation in the DRAM destroys the value in the cell so that the sensing has to be done during the Activate command in order to preserve the value. With an MRAM cell, the read can be done at any time after the row is active by passing a sensing current through the cell. MRAM can operate in either mode, row activation and sensing at the Activate command or row activation at the Activate command and sensing at the Read command. The advantage of moving the sensing to the Read command is allowing the selective activation of the banklets. If the sensing is done at the Activate command, the column address has to be provided at the Activate command or the whole row has to be read into the sense amplifiers.

Figure 8:
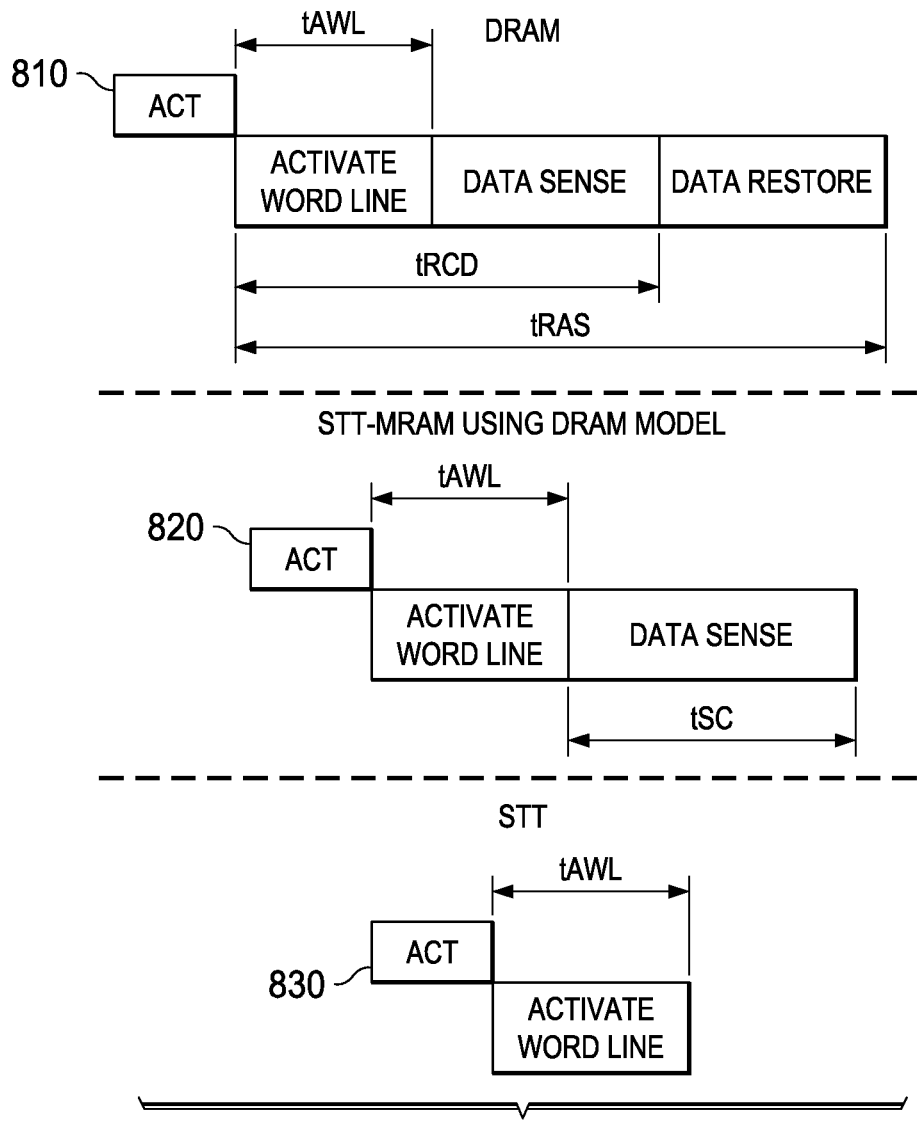
FIG. 8 illustrates a comparison of the processing of an activate command (ACT) sent by a memory controller to a memory array with regard to a DRAM, known STT-MRAM, and an improved STT-MRAM in accordance with the illustrative embodiments.

FIG. 8 illustrates a comparison of the processing of an Activate command (ACT) sent by a memory controller to a memory array with regard to a DRAM, known STT-MRAM, and an improved STT-MRAM in accordance with the illustrative embodiments. Labels of time frames in FIG. 8 are consistent with their definitions in the JEDEC specification unless otherwise indicated.

As shown in FIG. 8, in a DRAM architecture, in response to an activate command (ACT) 810 being transmitted, a corresponding word line of the DRAM is activated. The activation of the word line requires a time referred to as tAWL (time Activate Word Line). The minimum time frame between the Activate command and the pre-charge command is referred to as the tRAS. Thereafter, the data is sensed using the sense amps. The minimum time frame between the Activate command and a read or write command is referred to as tRCD. The data is then restored through the write back mechanisms previously described above.

In contrast, in a known STT-MRAM architecture, in response to an ACT command 820 being submitted, again the corresponding word line is activated, requiring a time tAWL and the data thereafter is sensed. The time needed to set up the bit lines and sense the values in the MRAM cells using sense amps is referred to as the tSC time frame.

In contrast to both the DRAM and known STT-MRAM architecture, with the improved STT-MRAM architecture of one illustrative embodiment, in response to the ACT command 830, the word line is activated requiring a time of tAWL. Thus, the data sensing of the known STT-MRAM architecture is moved from the Activate Command (ACT) processing to a Read command. Because the STT-MRAM does not require data restore operations, the data restore is not part of the STT-MRAM architecture's processing of the Activate Command (ACT).

The new Read command utilized with the illustrative embodiments activates only the required bit lines and senses the appropriate MRAM cells by passing a read current through the MRAM cells. When processing this new Read command, only a selected banklet is active in accordance with the activate command (ACT). This new Read command may be issued immediately after the activate command. Since the activation of the word line using the Activate command (ACT) is separated from the sensing of the MRAM cells, which is now done as part of the processing of the Read command, then word line activation may be performed concurrently with the sensing of MRAM cells. The Read operation in the MRAM is not destructive, allowing the Read operation to be active even when one word line is being deactivated and another word line is being activated. This allows for improved timing by interleaving the deactivation of one word line, activation of a next word line, and sensing operation if the previous and next operations are Read operations.

Figure 9:
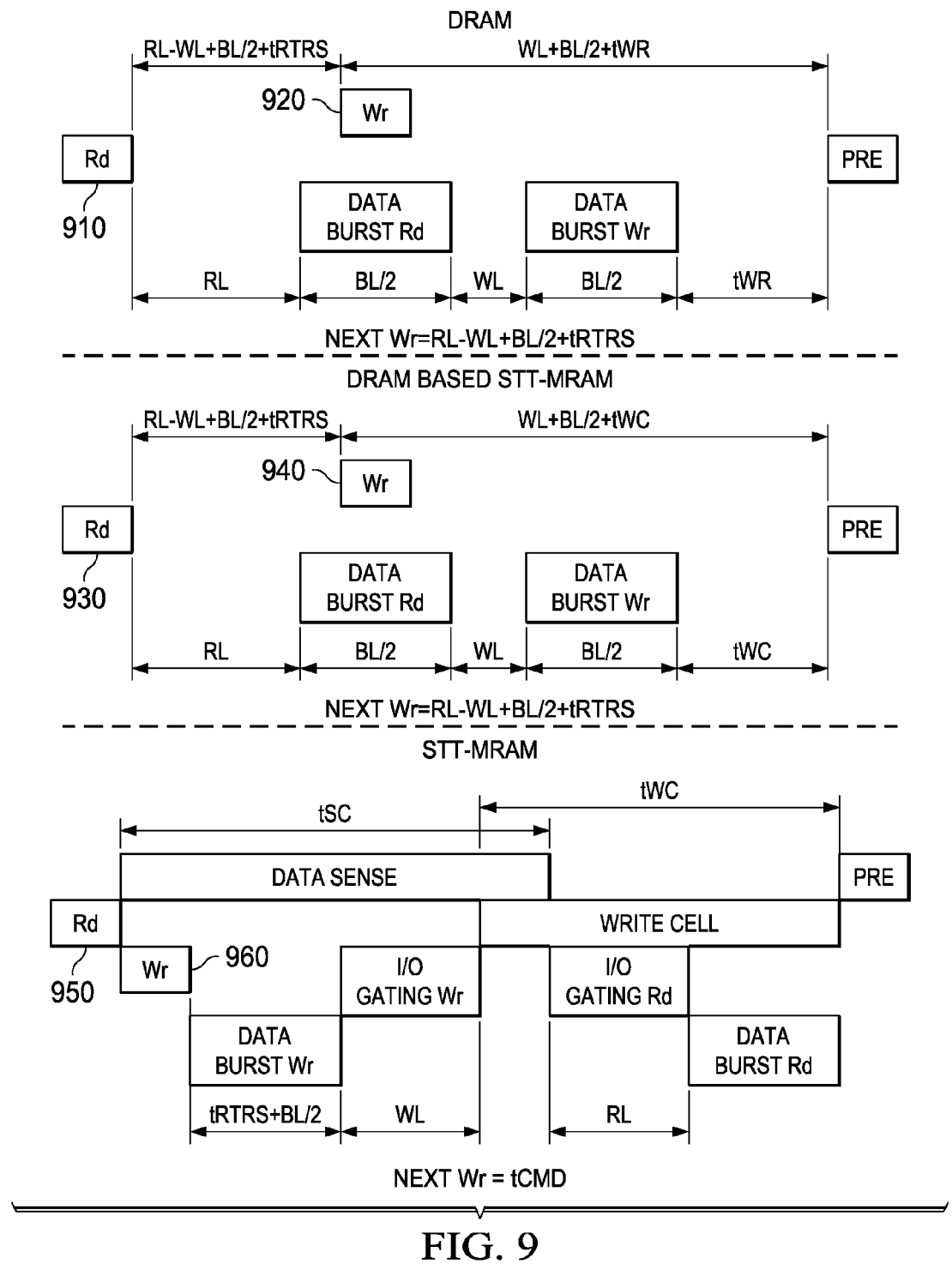
FIG. 9 illustrates a tighter packing of Read commands followed by Write commands of the illustrative embodiments in comparison with known DRAM and STT-MRAM architectures.

In addition to the above, the illustrative embodiments allow for tighter packing for a Read command followed by a Write command to different banklets. FIG. 9 illustrates the tighter packing of Read commands followed by Write commands of the illustrative embodiments in comparison with known DRAM and STT-MRAM architectures. In FIG. 9, tCAS (column address strobe) is defined as the time required to setup the column decoder and multiplexer to connect the sense amplifier to the output pin. The term tCL (column latency) refers to the same timing as tCAS. BL (burst length) is defined by the JEDEC standard as the number of data transfers in the bus (in the DDR case the time is BL/2 since there are two transfers per cycle). The term tRTRS (rank to rank turn around time) is defined to be the minimum time to send a command to a different rank of the memory. The term tCWD is defined as the time between the Write command and the data to be available on the data bus to be input to the device.

As shown in FIG. 9, when a Read command 910 is submitted in a DRAM architecture, the bank access is performed, then the IO gating, followed by the data burst read. Only after the read command is processed is the subsequent Write command 920 processed with a data burst write, 110 gating, and data restore. The write data arrives at the memory cell in a time frame approximately equal to RL+BL/2+WL+BL/2. The expression RL−WL+BL/2+tRTRS represents the time required to execute the a Write operation after a Read operation has been executed on the same bank and same row. The RL element is the time to select the specific column and send data via the I/O gating circuitry to the external peripheral interface, the BL/2 element is the time to send the data through the data bus, the tRTRS element represent the time to switch the direction of the bus, and the tCWD element is the time required to wait for the data to be placed on the bus for the Write operation (usually tCWD=0).

In a known STT-MRAM architecture, a similar processing of the Read 930 and subsequent Write 940 commands is performed with the write cell phase of the write command being somewhat longer than the data restore operation. With this arrangement, the write data arrives at the memory cell in a time frame approximately equal to tRTRS+BL/2+WL+ tWC.

With the illustrative embodiments, assuming that there are Read and Write commands to the same row, but different banklets, the Read and Write commands can be issued back-to-back by the memory controller. As shown in FIG. 9, the Read command 950 is submitted followed by a Write command 960 in a back-to-back manner. The data sensing of the Read command 950 is overlapped with the data burst write, I/O gating of the write. The write cell processing of the Write command is overlapped with the I/O gating and data burst of the read command. This overlapping of the Read and Write commands to the same row, but different banklets, provides a performance advantage over DRAMs and known STT-MRAMs as illustrated in FIG. 9 by providing tighter packing of Read commands followed by Write commands.

Figure 10:
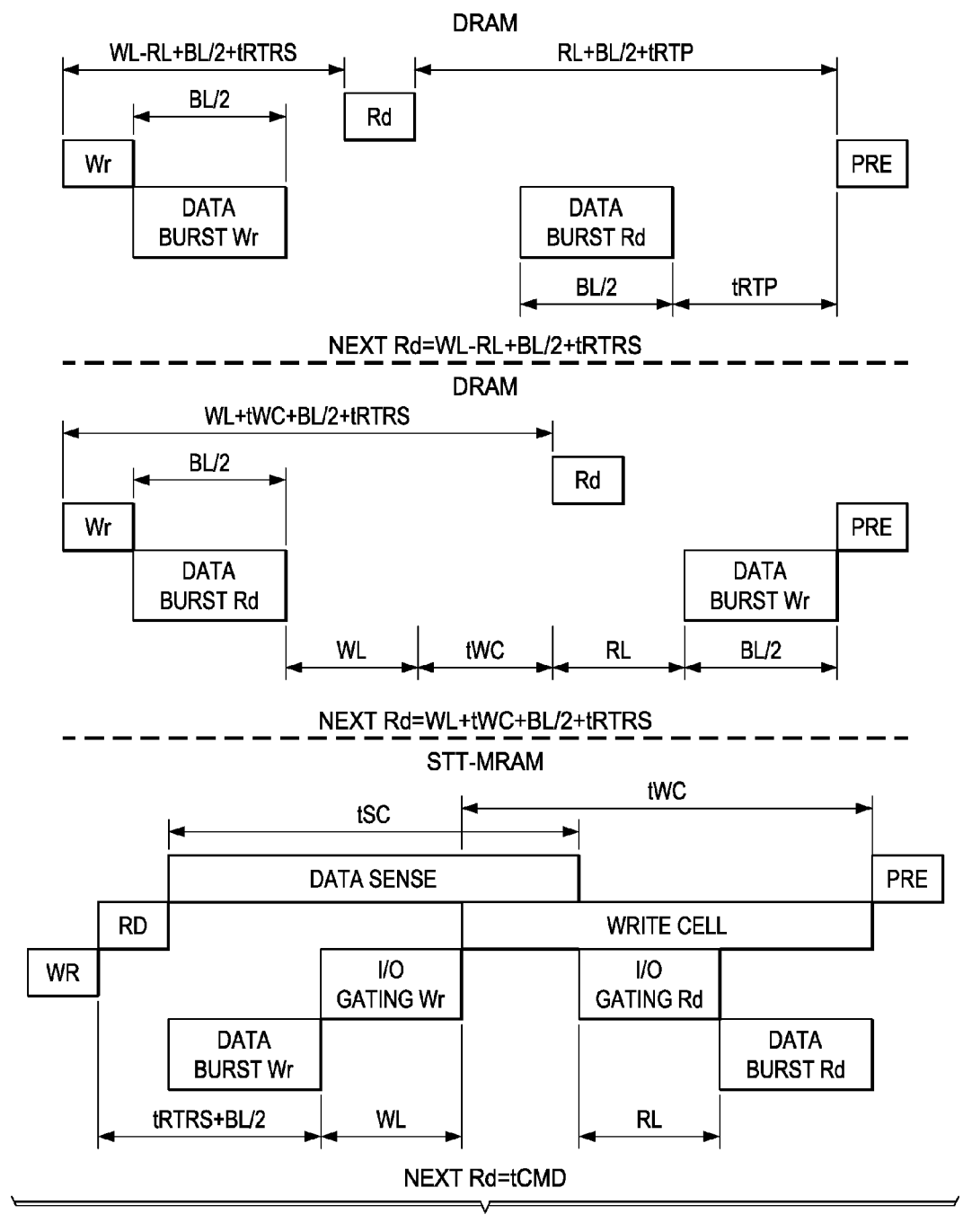
FIG. 10 illustrates a tighter packing of Write commands followed by Read commands of the illustrative embodiments in comparison with known DRAM and STT-MRAM architectures.

Similar performance advantages are obtained with regard to Write commands followed by Read commands as illustrated in FIG. 10. Again, as shown in FIG. 10, the timing required to complete the Read command after the Write is less than both the DRAM and known STT-MRAM architectures due in part to the overlapping reads and writes to the same row but different banklets and the ability to issue back-to-back read and write commands by the memory controller. That is, the time for the Read data to arrive in the architecture of the illustrative embodiment is approximately RL++tSC+tBL/2 which is less than the time required for receiving read data in the DRAM architecture (BL/2+tRTRS+RL+BL/2), and is less than the time required for receiving data in the known STT-MRAM architecture (BL/2+WL+tWC+RL+BL/2).

Figure 11:
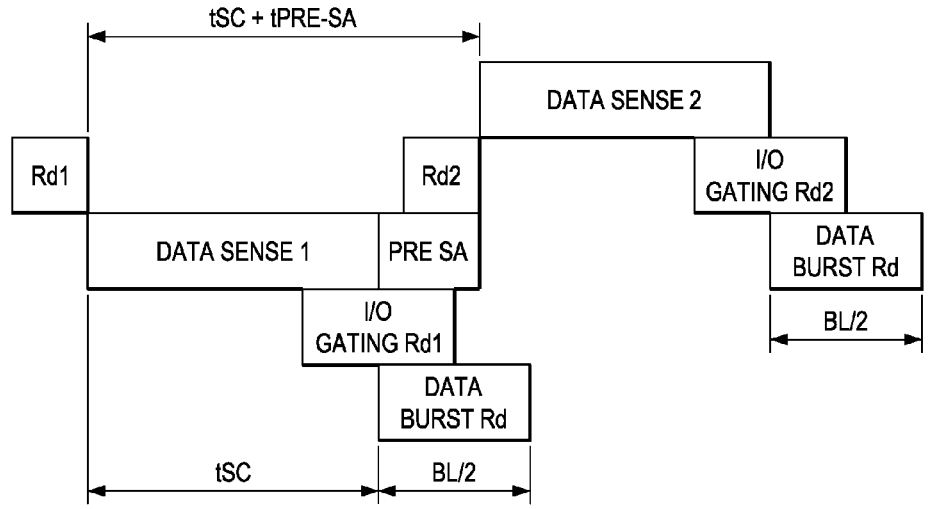
FIG. 11 illustrates the resetting of sense amps between two Read commands being issued to a same banklet in accordance with one illustrative embodiment.

In addition to the above performance improvements obtained through the use of banklets in a non-volatile memory architecture as described above, the illustrative embodiments further reduce pre-charge timing by eliminating the need to pre-condition the bit lines and require only the resetting of the sense amps between two reads in the same banklet. FIG. 11 illustrates the resetting of the sense amps between two Read commands being issued to the same banklet. As shown in FIG. 11, the time needed to reset the sense amps is referred to as tPRE-SA. The tPRE-SA is less than the time required for pre-conditioning bit lines in a DRAM case, i.e. tPRE-SA<tRP(DRAM). This allows for earlier issue of the subsequent Read command targeting the same banklet than would be possible in a DRAM architecture. In addition, this allows for tighter timing to be obtained since there is no required precharge of bit lines.

The movement of the sensing of the data from the Activate command to the Read command, which only senses appropriate bit lines of an enabled banklet, causes an open-page policy to be lost, where "open page" refers to the DRAM option to maintain a word line active after all the pending operations are done and only closing the page (deactivating the word line) when a new request for a different row address is executed. However, an open-page policy can be emulated by the memory controller by allowing dynamic row buffer/sense amp activation techniques due to the limited number of sense amplifiers being smaller than the number of bit columns such that sensing is repeated if different columns are required. The memory controller is optimized to issue back-to-back Read/Write commands to different banklets (same row), thereby allowing an on-demand open-page policy. This in turn provides a power-efficient open-page-like operation where only the banklets that are needed are turned on. In addition, dynamic row buffer/sense amp activation is made possible which can exploit row buffer locality by dynamically increasing the size of the row buffer (on-demand open paging). Moreover, improved power consumption is made possible since the multiplexers (between the columns and the sense amplifiers) take less space than sense-amps and have lower leakage power, and thus, a smaller row buffer width may be used.

Figure 12:
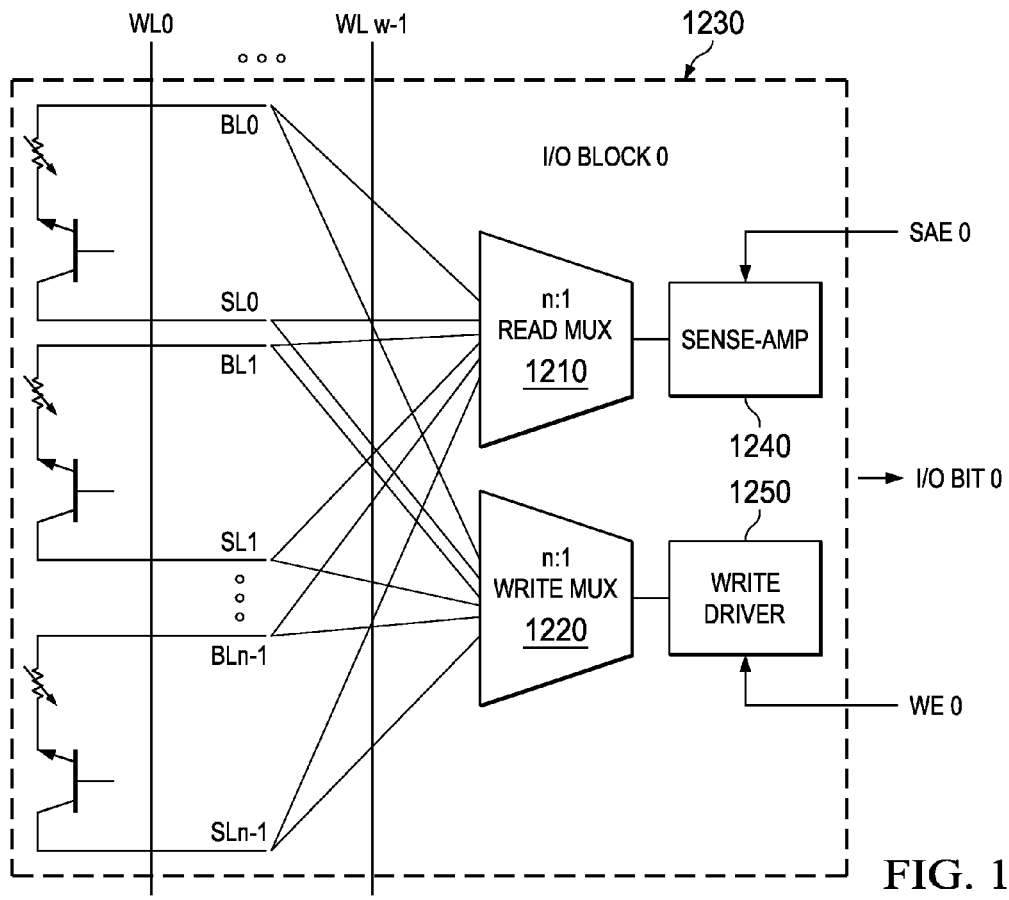
FIG. 12 is a diagram illustrating an optimization in which intra banklet Read and Write concurrency to the same row of a banklet is made possible by providing separate read and write multiplexers in accordance with one illustrative embodiment.

In a further optimization of the improved non-volatile memory architecture of the illustrative embodiments, intra banklet Read and Write concurrency to the same row of the banklet is made possible by providing separate read and write multiplexers. FIG. 12 illustrates such an optimization in which a separate n:1 Read multiplexer 1210 and separate n:1 Write multiplexers 1220 are provided in association with a banklet 1230. The Read and Write multiplexers 1210 and 1220 each provide outputs to each of the bit lines (BL0-BLn−1) and select lines (SL0-SLn−1) of the banklet 1230 for Reading/Writing. The Read multiplexer 1210 is coupled to a sense amp 1240 for the banklet 1230 whereas the write multiplexer 1220 is coupled to the write driver 1250 for the banklet 1230. Thus, sensing and writing circuitry are isolated with regard to the banklet 1230 by utilizing separate multiplexers 1210 and 1220. This allows read and write operations to proceed concurrently within the banklet in addition to the concurrent read/write operations that are performed between banklets but for the same row as previously described above.

Thus, the illustrative embodiments provide mechanisms for providing a low latency non-volatile memory architecture. The architecture is configured using banklets, within a bank of non-volatile memory cells, which may be individually enabled and peripheral banklet circuitry and banklet select circuitry which permits only a required set of bit lines for performing a read/write operation to be enabled within the banklet. The isolation of banklets within banks of a non-volatile memory enables tighter overlap of read/write operations with different banklets service reads and writes for different data simultaneously on a same row. Moreover, in some illustrative embodiments reads and writes to the same row within a banklet are made possible as well. These improvements lead to improved overall performance of the memory architecture. In addition power/energy consumption may be minimized by turning off idle banklets when they are not needed to perform the read/write operation.

It should be appreciated that while the illustrative embodiments are described in the context of a STT-MRAM architecture that is augmented to incorporate the mechanisms of the illustrative embodiments, the illustrative embodiments are not limited to such. Rather, other types of non-volatile memories may be used with the mechanisms of the illustrative embodiments without departing from the spirit and scope of the illustrative embodiments. For example, rather than a STT-MRAM architecture, a non-STT MRAM, Phase Change Memory (PCM), Resistive Random Access Memory (RRAM), or other types of non-volatile memories may be used as well.

Figure 13:
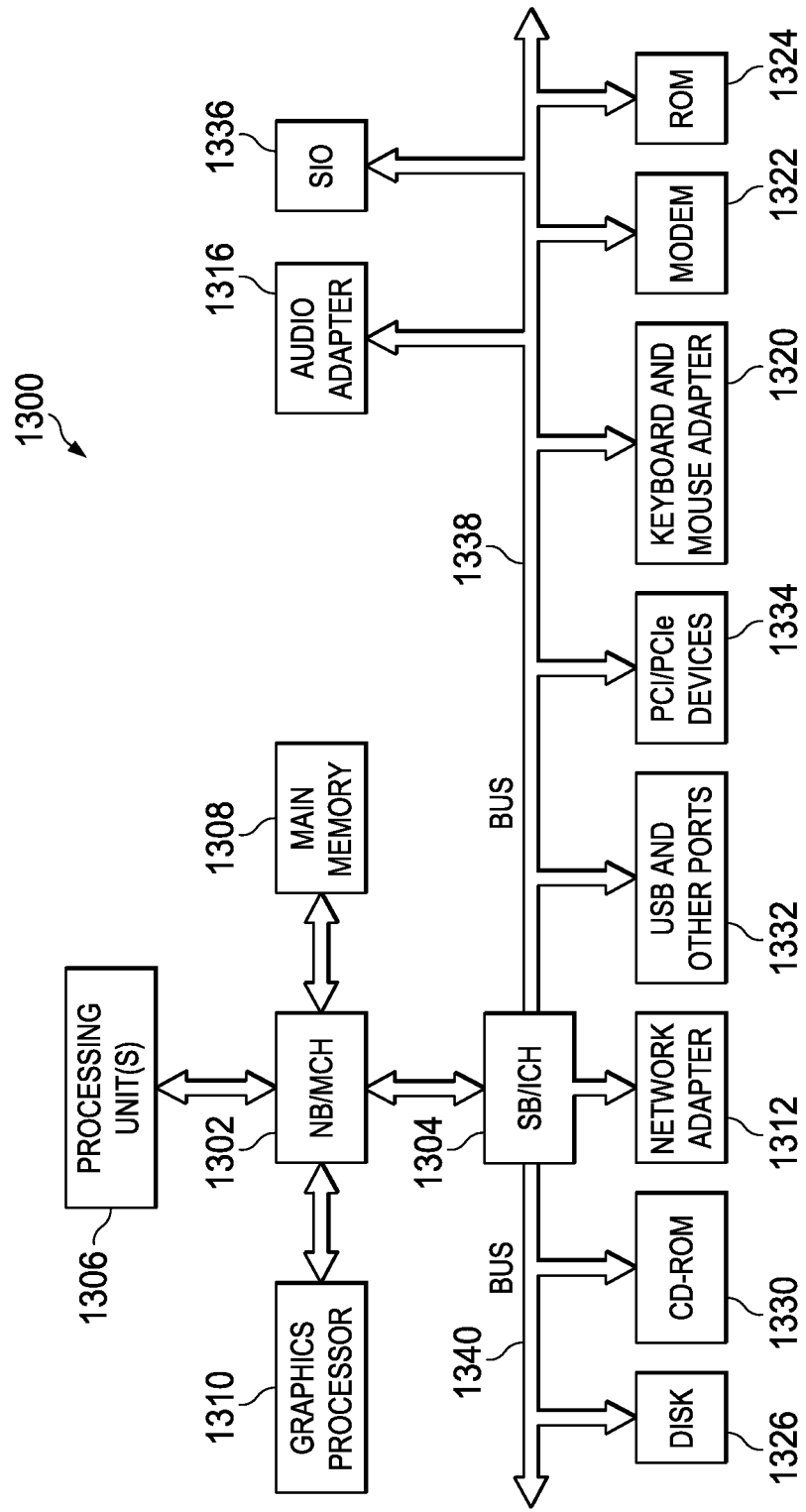
FIG. 13 is a block diagram of an example data processing system in which aspects of the illustrative embodiments may be implemented.

The memory architecture and memory controller methodologies of the illustrative embodiments may be utilized in many different types of data processing environments. In order to provide a context for the description of the specific elements and functionality of the illustrative embodiments, FIG. 13 is an example environment in which aspects of the illustrative embodiments may be implemented. It should be appreciated that FIG. 13 is only an example and is not intended to assert or imply any limitation with regard to the environments in which aspects or embodiments of the present invention may be implemented. Many modifications to the depicted environment may be made without departing from the spirit and scope of the present invention.

FIG. 13 is a block diagram of an example data processing system in which aspects of the illustrative embodiments may be implemented. Data processing system 1300 is an example of a computer, such as a client or server computer, in which a non-volatile memory may be implemented in accordance with the illustrative embodiments.

In the depicted example, data processing system 1300 employs a hub architecture including north bridge and memory controller hub (NB/MCH) 1302 and south bridge and input/output (I/O) controller hub (SB/ICH) 1304. Processing unit 1306, main memory 1308, and graphics processor 1310 are connected to NB/MCH 1302. Graphics processor 1310 may be connected to NB/MCH 1302 through an accelerated graphics port (AGP). In accordance with the mechanisms of the illustrative embodiments, the main memory 1308 may be implemented as a non-volatile memory comprising the banks, banklets, peripheral banklet circuitry, banklet select circuitry, and memory controller mechanisms described previously. For example, the main memory 1308 may be configured as shown in FIGS. 4 and 5, for example.

In the depicted example, local area network (LAN) adapter 1312 connects to SB/ICH 1304. Audio adapter 1316, keyboard and mouse adapter 1320, modem 1322, read only memory (ROM) 1324, hard disk drive (HDD) 1326, CD-ROM drive 1330, universal serial bus (USB) ports and other communication ports 1332, and PCI/PCIe devices 1334 connect to SB/ICH 1304 through bus 1338 and bus 1340. PCI/PCIe devices may include, for example, Ethernet adapters, add-in cards, and PC cards for notebook computers. PCI uses a card bus controller, while PCIe does not. ROM 1324 may be, for example, a flash basic input/output system (BIOS).

HDD 1326 and CD-ROM drive 1330 connect to SB/ICH 1304 through bus 1340. HDD 1326 and CD-ROM drive 1330 may use, for example, an integrated drive electronics (IDE) or serial advanced technology attachment (SATA) interface. Super I/O (SIO) device 1336 may be connected to SB/ICH 1304.

An operating system runs on processing unit 1306. The operating system coordinates and provides control of various components within the data processing system 1300 in FIG. 13. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 1300.

As a server, data processing system 1300 may be, for example, an IBM® eServer™ System p® computer system, running the Advanced Interactive Executive (AIX®) operating system or the LINUX® operating system. Data processing system 1300 may be a symmetric multiprocessor (SMP) system including a plurality of processors in processing unit 1306. Alternatively, a single processor system may be employed.

Instructions for the operating system, the object-oriented programming system, and applications or programs are located on storage devices, such as HDD 1326, and may be loaded into main memory 1308 for execution by processing unit 1306. The processes for illustrative embodiments of the present invention may be performed by processing unit 1306 using computer usable program code, which may be located in a memory such as, for example, main memory 1308, ROM 1324, or in one or more peripheral devices 1326 and 1330, for example.

A bus system, such as bus 1338 or bus 1340 as shown in FIG. 13, may be comprised of one or more buses. Of course, the bus system may be implemented using any type of communication fabric or architecture that provides for a transfer of data between different components or devices attached to the fabric or architecture. A communication unit, such as modem 1322 or network adapter 1312 of FIG. 13, may include one or more devices used to transmit and receive data. A memory may be, for example, main memory 1308, ROM 1324, or a cache such as found in NB/MCH 1302 in FIG. 13.

Those of ordinary skill in the art will appreciate that the hardware in FIG. 13 may vary depending on the implementation. Other internal hardware or peripheral devices, such as flash memory, equivalent non-volatile memory, or optical disk drives and the like, may be used in addition to or in place of the hardware depicted in FIG. 13. Also, the processes of the illustrative embodiments may be applied to a multiprocessor data processing system, other than the SMP system mentioned previously, without departing from the spirit and scope of the present invention.

Moreover, the data processing system 1300 may take the form of any of a number of different data processing systems including client computing devices, server computing devices, a tablet computer, laptop computer, telephone or other communication device, a personal digital assistant (PDA), or the like. In some illustrative examples, data processing system 1300 may be a portable computing device that is configured with flash memory to provide non-volatile memory for storing operating system files and/or user-generated data, for example. Essentially, data processing system 1300 may be any known or later developed data processing system without architectural limitation.

The memory system, apparatus, device, or circuit as described above may be part of the design for an integrated circuit chip. In such a case, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory, comprising:
   a bank of non-volatile memory cells configured into a plurality of banklets, wherein each banklet in the plurality of banklets is separately able to be enabled independently of the other banklets in the bank of non-volatile memory cells;

peripheral banklet circuitry, coupled to the bank of non-volatile memory cells, that is configured to enable selected subsets of bit lines within a selected banklet within the plurality of banklets; and banklet select circuitry, coupled to the peripheral banklet circuitry, that is configured to select data associated with a selected banklet for reading out from the banklet or writing to the banklet.

2. The memory of claim 1, wherein the plurality of banklets share word lines such that a same word line is shared by each of the banklets in the plurality of banklets, and wherein each banklet in the plurality of banklets has an exclusive banklet enable line that activates a corresponding sense-amps enable and corresponding write enable signal line of the banklet.

3. The memory of claim 1, wherein the bank of non-volatile memory cells is a bank of Spin Transfer Torque Magnetoresistive Random Access Memory (STT-MRAM) cells.

4. The memory of claim 1, wherein the peripheral banklet circuitry receives a banklet enable signal from a column decoder coupled to the peripheral banklet circuitry, wherein the banklet enable signal enables a specific banklet within the plurality of banklets for performing an access operation.

5. The memory of claim 4, wherein the column decoder further provides the banklet enable signal to the banklet select circuitry, coupled to the peripheral banklet circuitry, as an input.

6. The memory of claim 1, further comprising a memory controller coupled to the bank of non-volatile memory cells, wherein the memory controller is configured to utilize a Read command that activates only required bit lines in a selected banklet and senses selected non-volatile memory cells of the banklet by passing a read current through the selected non-volatile memory cells, and wherein an activate command used by the memory controller does not sense the selected non-volatile memory cells.

7. The memory of claim 6, wherein the memory controller is further configured to provide back-to-back issuance of read and write commands to a same row of non-volatile memory cells with the same activated word line in different banklets of the bank of non-volatile memory cells.

8. The memory of claim 6, wherein the memory controller is further configured to overlap read and write commands to a same row of non-volatile memory cells in different banklets of the bank of non-volatile memory cells.

9. The memory of claim 1, wherein the bank is a memory array with dedicated row and column decoder, sense-amp set, row buffer, and input/output lanes from the sense-amp set to the row buffer, and wherein each banklet is a portion of the bank with its own independent row buffer, independently controlled read-write circuits, and independent read-write column switches fed from a column decoder associated with the bank.

10. The memory of claim 9, wherein each banklet comprises a first independent circuit that comprises column switches and sense-amps for read operations and a second independent circuit comprising column switches and write drivers for write operations.

11. The memory of claim 10, where the controller is configured to execute read operations and write operations concurrently on a same banklet in the plurality of banklets.

12. A method comprising:

providing a bank of non-volatile memory cells configured into a plurality of banklets, wherein each banklet in the plurality of banklets is separately able to be enabled independently of the other banklets in the bank of non-volatile memory cells;

providing peripheral banklet circuitry, coupled to the bank of non-volatile memory cells, that is configured to enable selected subsets of bit lines within a selected banklet within the plurality of banklets; and providing banklet select circuitry, coupled to the peripheral banklet circuitry, that is configured to select data associated with a selected banklet for reading out from the banklet or writing to the banklet; and fabricating an integrated circuit device comprising the provided bank, peripheral banklet circuitry, and banklet select circuitry.

13. A computer, comprising:

a processor; and a memory coupled to the processor, wherein the memory comprises:

a bank of non-volatile memory cells configured into a plurality of banklets, wherein each banklet in the plurality of banklets is separately able to be enabled independently of the other banklets in the bank of non-volatile memory cells;

peripheral banklet circuitry, coupled to the bank of non-volatile memory cells, that is configured to enable selected subsets of bit lines within a selected banklet within the plurality of banklets; and banklet select circuitry, coupled to the peripheral banklet circuitry, that is configured to select data associated with a selected banklet for reading out from the banklet or writing to the banklet.

14. The computer of claim 13, wherein the plurality of banklets share word lines such that a same word line is shared by each of the banklets in the plurality of banklets, and wherein each banklet in the plurality of banklets has an exclusive banklet enable line that activates a corresponding sense-amp enable and corresponding write enable signal line of the banklet.

15. The computer of claim 13, wherein the bank of non-volatile memory cells is a bank of Spin Transfer Torque Magnetoresistive Random Access Memory (STT-MRAM) cells.

16. The computer of claim 13, wherein the memory further comprises a column decoder, and wherein the peripheral banklet circuitry receives a banklet enable signal from a column decoder coupled to the peripheral banklet circuitry, wherein the banklet enable signal enables a specific banklet within the plurality of banklets for performing an access operation.

17. The computer of claim 16, wherein the column decoder further provides the banklet enable signal to the banklet select circuitry, coupled to the peripheral banklet circuitry, as an input.

18. The computer of claim 13, wherein the memory further comprises a memory controller coupled to the bank of non-volatile memory cells, wherein the memory controller is configured to utilize a Read command that activates only required bit lines in a selected banklet and senses selected non-volatile memory cells of the banklet by passing a read current through the selected non-volatile memory cells, and wherein an activate command used by the memory controller does not sense the selected non-volatile memory cells.

19. The computer of claim 18, wherein the memory controller is further configured to provide back-to-back issuance of read and write commands to a same row of non-volatile memory cells in different banklets of the bank of non-volatile memory cells.

20. The computer of claim 18, wherein the memory controller is further configured to overlap read and write commands to a same row of non-volatile memory cells in different banklets of the bank of non-volatile memory cells.

* * * * *